(12) United States Patent
Lee

(10) Patent No.: US 12,156,389 B2
(45) Date of Patent: Nov. 26, 2024

(54) ELECTROMAGNETIC WAVE SHIELDING STRUCTURE OF WEARABLE EL PRODUCT

(71) Applicant: LUMMIGLOBAL CO., LTD., Asan-si (KR)

(72) Inventor: Doo Won Lee, Ansan-si (KR)

(73) Assignee: LUMMIGLOBAL CO., LTD., Asan-si (KR)

( * ) Notice: Subject to any disclaimer, the term of this patent is extended or adjusted under 35 U.S.C. 154(b) by 83 days.

(21) Appl. No.: 17/777,197

(22) PCT Filed: Nov. 13, 2020

(86) PCT No.: PCT/KR2020/015980
§ 371 (c)(1),
(2) Date: May 16, 2022

(87) PCT Pub. No.: WO2021/096283
PCT Pub. Date: May 20, 2021

(65) Prior Publication Data
US 2023/0363124 A1 Nov. 9, 2023

(30) Foreign Application Priority Data

Nov. 15, 2019 (KR) .................. 10-2019-0147076
Nov. 15, 2019 (KR) .................. 10-2019-0147077
(Continued)

(51) Int. Cl.
*H05K 9/00* (2006.01)
*H01B 7/04* (2006.01)

(52) U.S. Cl.
CPC ............ *H05K 9/0043* (2013.01); *H01B 7/04* (2013.01); *H05K 9/0054* (2013.01)

(58) Field of Classification Search
CPC .................................................. H05K 9/0054
See application file for complete search history.

(56) References Cited

U.S. PATENT DOCUMENTS

2004/0074655 A1* 4/2004 Takahashi ............ H05K 9/0096
174/392
2004/0113541 A1* 6/2004 Watanabe .............. A63H 33/22
313/500
(Continued)

FOREIGN PATENT DOCUMENTS

JP S60-218797 A 11/1985
JP H09-283278 A 10/1997
(Continued)

OTHER PUBLICATIONS

Jun. 27, 2023 Office Action issued in Japanese Patent Application No. 2022-528338.
(Continued)

*Primary Examiner* — Hung V Ngo
(74) *Attorney, Agent, or Firm* — Oliff PLC

(57) ABSTRACT

A wearable EL product electromagnetic wave shield structure includes a light emitting unit, an electric wire member extending from the light emitting unit, and an inverter for controlling power on/off and operation of the light emitting unit, and is washable and flexible to be applicable to all items that can be worn by humans. The light emitting unit includes an EL member applied with a fluorescent material according to a certain shape or pattern, an insulator respectively disposed on the EL member front and rear surfaces, a front electrode member disposed on the opposite side of the front side insulator from the EL member to shield electromagnetic waves emitted from the EL member, a rear electrode member disposed on the opposite side of the rear side insulator from the EL member to shield electromagnetic waves emitted from the EL member, and a base member for supporting the front electrode member.

16 Claims, 10 Drawing Sheets

(30) Foreign Application Priority Data

Mar. 24, 2020 (KR) ........................ 10-2020-0035640
Jun. 17, 2020 (KR) ........................ 10-2020-0073589

(56) References Cited

U.S. PATENT DOCUMENTS

| | | | | |
|---|---|---|---|---|
| 2014/0327356 | A1* | 11/2014 | Nakai | G06K 7/00 315/34 |
| 2015/0138699 | A1* | 5/2015 | Yamazaki | H01M 50/466 361/679.03 |
| 2016/0109852 | A1* | 4/2016 | Kuwabara | G04G 17/045 368/223 |
| 2018/0204884 | A1* | 7/2018 | Isa | H05B 33/26 |

FOREIGN PATENT DOCUMENTS

| | | | |
|---|---|---|---|
| JP | 2001-284053 | A | 10/2001 |
| JP | 2004-265758 | A | 9/2004 |
| JP | 3113456 | U | 9/2005 |
| JP | 2009-105027 | A | 5/2009 |
| JP | 2011-044372 | A | 3/2011 |
| JP | 2013-168643 | A | 8/2013 |
| JP | 2013-191409 | A | 9/2013 |
| JP | 2018-102964 | A | 7/2018 |
| KR | 10-2005-0051504 | A | 6/2005 |
| KR | 10-2006-0005439 | A | 1/2006 |
| KR | 10-2006-0132853 | A | 12/2006 |
| KR | 20-2008-0006483 | U | 12/2008 |
| KR | 10-2019-0101584 | A | 9/2019 |
| KR | 10-2123993 | B1 | 6/2020 |

OTHER PUBLICATIONS

Dec. 19, 2023 Office Action issued in Japanese Patent Application No. 2022-528338.
Sep. 28, 2020 Office Action issued in Korean Patent Application No. 10-2020-0073589.
Jun. 10, 2020 Office Action issued in Korean Patent Application No. 10-2020-0035640.
Dec. 6, 2019 Office Action issued in Korean Patent Application No. 10-2019-0147077.
Jan. 14, 2020 Office Action issued in Korean Patent Application No. 10-2019-0147076.
Feb. 18, 2021 International Search Report issued in International Patent Application No. PCT/KR2020/015980.

* cited by examiner

ELECTROMAGNETIC WAVE SHIELDING STRUCTURE OF WEARABLE EL PRODUCT

FIELD OF THE INVENTION

The present invention relates to a wearable EL product that is washable and flexible so as to be applicable to all items that can be worn by a person, including clothing, hats, footwear, gloves, and accessories. More particularly, the present invention relates to an electromagnetic wave shielding structure for shielding electromagnetic waves emitted from the wearable EL product.

BACKGROUND OF THE INVENTION

Smart wear refers to next-generation clothing products that integrate various digital devices necessary for daily life into clothes, shoes, hats, and various accessories. Recently, along with the development of wearable devices, organic electro-luminescence (EL) technology is emerging as a promising future technology.

An Electro-Luminescence (EL) device emits light by electrical stimulation of fluorescent crystals evenly distributed between two electrodes with excellent conductivity. When an AC voltage is applied to the EL device, the electric field causes a fluorophore to charge and discharge rapidly. The phenomenon in which the movement of electrons appears as light in such a cyclic process is called the EL.

Typically, the magnetic field (unit: nT) is generated in proportion to a current flowing in a conductor connected to the EL device, and the electric field (unit: V/m) is generated in proportion to a variation in voltage.

Therefore, in the case of wearable products to be worn close to the human body, electromagnetic wave (electromagnetic field) shield is absolutely required for the EL device.

Meanwhile, Korean Patent Application Publication No. 10-2005-0051504 discloses an electromagnetic wave shield structure of an organic electroluminescence display device. According to this patent application, the organic electroluminescence display device includes a plurality of pixel units including a transistor formed on a substrate, and an EL element formed by deposition on an upper surface of the transistor and having an upper electrode, an EL layer, and a lower electrode. An electromagnetic wave shield film is formed on the upper portion of the EL element, the electromagnetic wave shield film is composed of a transparent conductive material, and the transparent conductive material is ITO.

However, the above-mentioned application relates to an electromagnetic wave shield structure for preventing screen shaking phenomenon due to Electromagnetic Interference (EMI) and noise coming from the outside of various flat panel display devices, which is conceptually clearly different from the structure for shielding Electromagnetic fields (EMF: fields created by alternating current electricity and electrical devices using the same) according to the present invention. That is, the above-mentioned filed invention is not for shielding an electromagnetic field. Moreover, the above-mentioned filed invention is limited to a luminescence display device using an organic EL, and thus, there is a limit to the application to, for example, a luminescence display device using an inorganic EL. In particular, in the case of wearable EL product that is generally worn in close to the human body, rather than the flat panel display device as described above, shielding of electromagnetic waves generated from the respective components of the EL product is essential. However, the above-mentioned filed invention and the modified technologies thereof have a limit in completely shielding electromagnetic waves generated from the respective components of a typical wearable EL product.

In addition, common wearable devices, for example, wearable EL products may be generally exposed to moisture or receive a large amount of shock from the outside as much as they are exposed to an outdoor environment, and in the case of electric wires, they may be easily damaged by such a shock.

In particular, when the wearable EL products are applied to mountain-climbing clothes or running wears, etc., a lot of folding or friction may occur in the mountain-climbing clothes or running and wears, the like due to the characteristic of the outdoor wear, and thereby the internal wires may be damaged or there may be difficulty in washing. In particular, in the case of clothes, the problem in which the wearing comfort is lowered by the damage of the electric wires may occur.

Therefore, there is an urgent need to develop a wearable device that may prevent the disconnection of the electric wire provided for the wearable device or the disconnection of a connection portion, and also does not cause the reduction of wearing comfort due to the wires.

DETAILED DESCRIPTION OF THE INVENTION

Technical Problem

Accordingly, the present invention has been made to solve the above problems, and an object of the present invention is to provide a safe wearable EL product without leakage of electromagnetic waves by being provided with electromagnetic wave shield structures for the respective components of the wearable EL product.

Another object of the present invention is to provide a safe wearable EL product that has excellent wearability and washability when applied to a wearable device and does not have a risk of the disconnection in the connection portion.

Means for Solving the Problem

One aspect of the present invention for achieving the above object provides an electromagnetic wave shield structure of a wearable EL product that comprises a light emitting unit which is a luminous body, an electric wire member extending from the light emitting unit, and an inverter for controlling the power-on/off and the operation of the light emitting unit, and is washable and flexible so as to be applicable to all items that can be worn by humans, including clothing, hats, footwears, gloves, and accessories, wherein the light emitting unit comprises an EL member that is an electroluminescence element coated with a fluorescent material according to a certain shape or pattern, hot melts respectively applied to the front and rear surfaces of the EL member, a rear shield attached to the rear surface of the EL member by the hot melt to shield electromagnetic waves emitted from the EL member, and a front shield attached to the front surface of the EL member by the hot melt to shield electromagnetic waves emitted from the EL member, wherein the EL member, the rear shield and the front shield are formed on a polyurethane film which is flexible, and the rear shield and the front shield are composed of a transparent electrode material, respectively, and wherein the electromagnetic wave shield structure is configured to shield electromagnetic waves emitted from the light emitting unit by allowing electrical conduction among the EL member, the rear shield, and the front shield.

Another aspect of the present invention for achieving the above object provides an electromagnetic wave shield structure of a wearable EL product that comprises a light emitting unit which is a luminous body, an electric wire member extending from the light emitting unit, and an inverter for controlling power on/off and operation of the light emitting unit, and is flexible and washable so as to be applicable to all items that can be worn by humans, including clothing, hats, footwear, gloves, and accessories, wherein the light emitting unit includes an EL member that is a electroluminescence element applied with a fluorescent material according to a certain shape or pattern, an insulator respectively disposed on the front and rear surfaces of the EL member, a front electrode member disposed on the opposite side of the front side insulator from the EL member to shield electromagnetic waves emitted from the EL member, a rear electrode member disposed on the opposite side of the rear side insulator from the EL member to shield electromagnetic waves emitted from the EL member, and a base member for supporting the front electrode member, wherein the front electrode member and the rear electrode member are made of a transparent electrode material, respectively, the EL member has a structure obtained by applying and laminating at least a transparent electrode layer, a fluorescent layer, a dielectric layer, and a conductive layer in this order on a substrate having a predetermined thickness, and each of the electrode members has one or more connection terminals formed to be electrically connected to each part of the circuit of the conductive layer, and wherein as a structure for shielding electromagnetic waves emitted from the EL member, the light emitting unit is connected to any one of the plurality of circuits on the surface of the conductive layer to be grounded to the negative terminal (−) of the battery in the inverter through the electric wire member in a state in which the front electrode member rear and the electrode member are electrically connected to each other, and wherein the EL member has a ground terminal connected to at least one line of the electric wire member grounded to the negative terminal (−) of the battery in the inverter, said ground terminal being electrically connected to any one of the connection terminals of the rear electrode member and any one of the connection terminals of the front electrode member corresponding thereto, and wherein the rear side insulator and the front side insulator of the EL member have through-holes respectively formed at locations corresponding to the connection terminal of the rear electrode member and the connection terminal of the front electrode member, and for electrical conduction between the connection terminal of the rear electrode member and the connection terminal of the front electrode member corresponding thereto, the EL member and the rear side insulator and the front side insulator of the EL member have through-holes respectively formed thereon.

The Effect of the Invention

From the above-mentioned characteristics, the present invention can provide a wearable EL product that can be safely used without leakage of electromagnetic waves by providing a structure to completely shield electromagnetic waves generated from each component of the wearable EL product that is worn close to the human body, that is, the light emitting unit, the electric wire part, and the inverter.

In addition, the present invention allows the user to feel less irritation from wearable devices that are worn close to the human body, especially wearable EL products with electromagnetic wave shielding function, and at the same time, used safely without risk of disconnection at the connection portion to which the connector terminal is bound even after long-term use.

BRIEF DESCRIPTION OF THE DRAWINGS

FIGS. 2 to 7 show a first embodiment of the configuration of the wearable EL product of FIG. 1;

FIG. 2 is a cross-sectional view for illustrating the electromagnetic wave shield structure of the light emitting unit in the configuration of FIG. 1, wherein

FIG. 3 is a cross-sectional view showing an electromagnetic wave shield structure of an electric wire member in the configuration of FIG. 1;

FIG. 4 is a cross-sectional view showing the electromagnetic wave shield structure of an inverter in the configuration of FIG. 1;

FIG. 5 is a top view for illustrating the process of forming a flexible wire for the electric wire member of FIG. 1 by applying a conductive paste to the base film;

FIG. 6 is a cross-sectional view for illustrating an assembled state of a part of the flexible electric wire according to FIG. 5;

FIG. 7 is a top view for illustrating an assembled state of a part of the flexible electric wire according to FIG. 6;

FIGS. 8 to 10 illustrates a second embodiment of the configuration of the wearable EL product of FIG. 1;

FIG. 8 is a cross-sectional view of a first portion of the light emitting unit for explaining the operation structure of the light emitting unit in the configuration of FIG. 1, wherein

FIG. 9 is a cross-sectional view of a second part of the light emitting unit for explaining the electromagnetic wave shield structure of the light emitting unit according to FIG. 8, wherein FIG. 10 is a cross-sectional view for illustrating an electromagnetic wave shield structure of the electric wire member in the configuration of FIG. 1.

MODE FOR CARRYING OUT THE INVENTION

Figure 1:
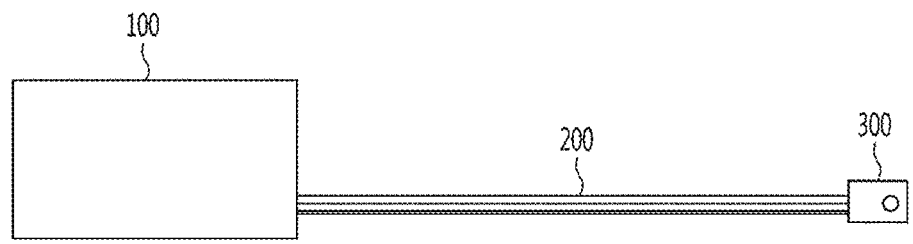
FIG. 1 is a view showing the configuration of a wearable EL product according to the present invention.

Hereinafter, preferred embodiments of the present invention will be described with reference to the accompanying drawings.

In the following embodiments, portions excluding inevitable portions in the explanation of the invention, the illustration and explanation thereof are omitted, and the same reference numerals are assigned to the same or similar elements throughout the description and detailed explanation thereof will be omitted without repetition.

Embodiment 1

FIG. 1 illustrates the configuration of a wearable EL product to which a flexible electric wire according to the present invention is applied. The wearable EL product that can be applied to all products that can be worn by humans, such as various clothes, hats, gloves, footwears, and accessories, the wearable EL product comprising: a light emitting unit 100 which is a luminous body, an electric wire member 200 extending from the light emitting unit, and an inverter 300 for controlling power on/off and operation of the light emitting unit. Due to the characteristic of the wearable product, at least the light emitting unit 100 and the electric wire member 200 are preferably made of a thin and flexible material so as to be washable and not to be uncomfortable to wear.

Figure 2A:
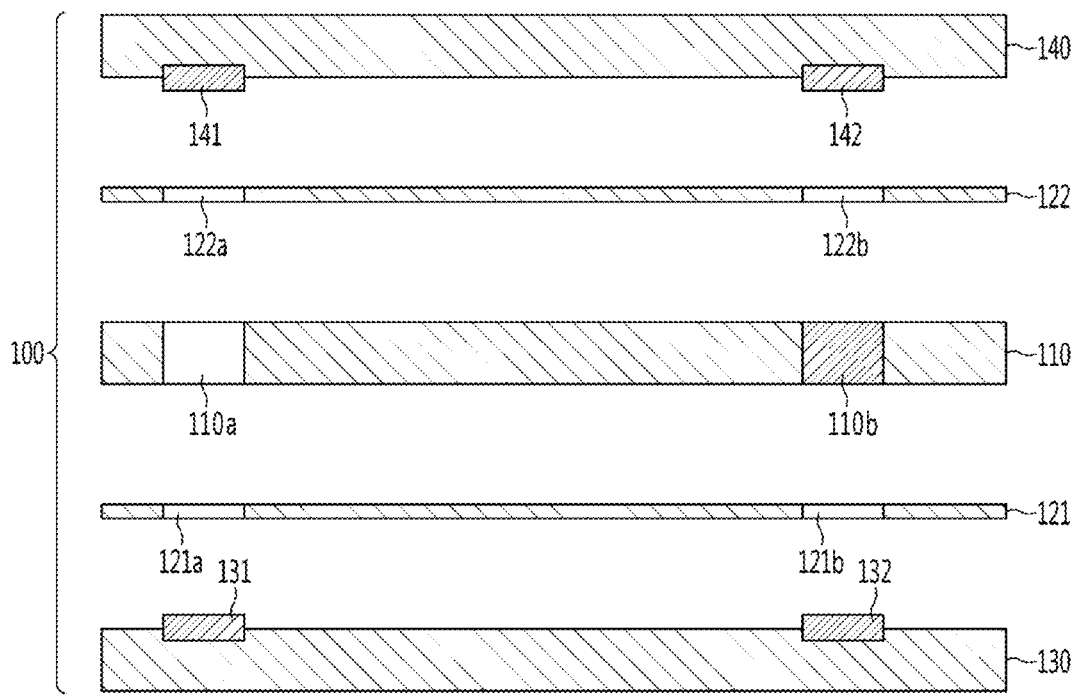
FIG. 2A is an exploded cross sectional view of the light emitting unit.
Figure 2B:
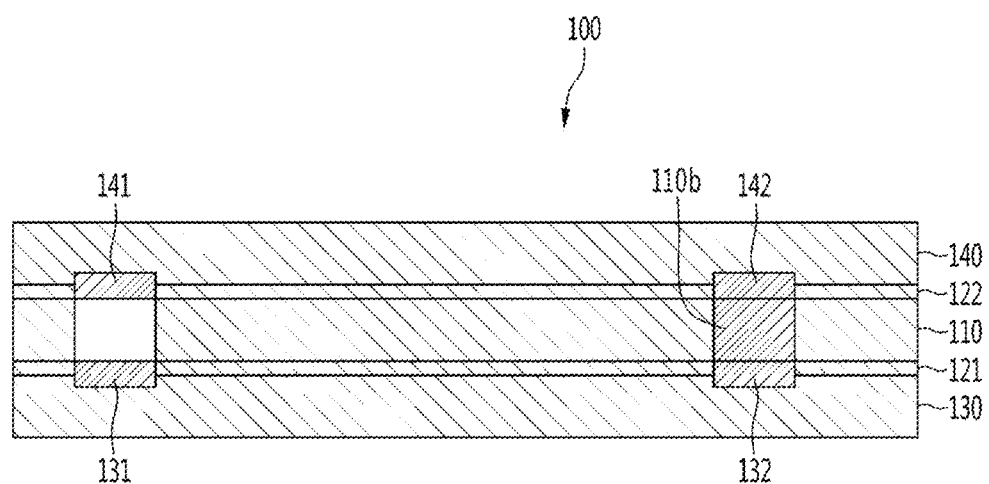
FIG. 2B is an assembly cross sectional view of the light emitting unit.

FIG. 2 is a cross-sectional view for illustrating the electromagnetic wave shield structure of the light emitting unit in the configuration of FIG. 1, wherein FIG. 2A is an exploded cross sectional view of the light emitting unit, and FIG. 2B is an assembly cross sectional view of the light emitting unit. The light emitting 100 for shielding electromagnetic waves basically includes an EL member 110 that is an electroluminescence element coated with a fluorescent material according to a certain shape or pattern, hot melts 121 and 122 respectively applied to rear and front surfaces of the EL member 110, a rear shield 130 attached to the rear surface of the EL member 110 through the hot melt 121 to shield electromagnetic waves emitted from the EL member 110, and a front shield 140 attached to the front surface of the EL member 110 through the hot melt 122 to shield electromagnetic waves emitted from the EL member 110.

The EL member 110, the rear shield 130, and the front shield 140 are basically formed on a polyurethane (PU) film which is a flexible material, and a plurality of circuits may be formed on the surface of the EL member 110. In any one of these circuits, a ground terminal: for grounding by electrically connecting to the negative terminal (−) of the battery 340 (see FIG. 4) is provided.

The rear shield 130 and the front shield 140 are formed of a transparent electrode material, respectively, and on the surface of the respective shields 130 and 140, one or more of connection terminals 131 and 132, 141 and 142 for connection to the ground terminal 110b of the EL member 110 may be provided. In addition, the rear shield 130 and the front shield 140 may be formed of not only the transparent electrode material, but also at least one or more selected from the group consisting of at least silver (Ag), gold (Au), copper (Cu), iron (Fe), nickel, and aluminum (Al). Further, as illustrated in the drawing, in order to electrically connect the connection terminals 131, 141, 132 and 142 formed on the surfaces of the rear shield 130 and the front shield 140 to the ground terminal 110b, through holes 110a, 121a, 121b, 122a, and 122b which correspond to the connection terminals 131, 141, 132, and 142 may be formed in the EL member 110 and the hot melts 121 and 122, respectively.

Figure 3:
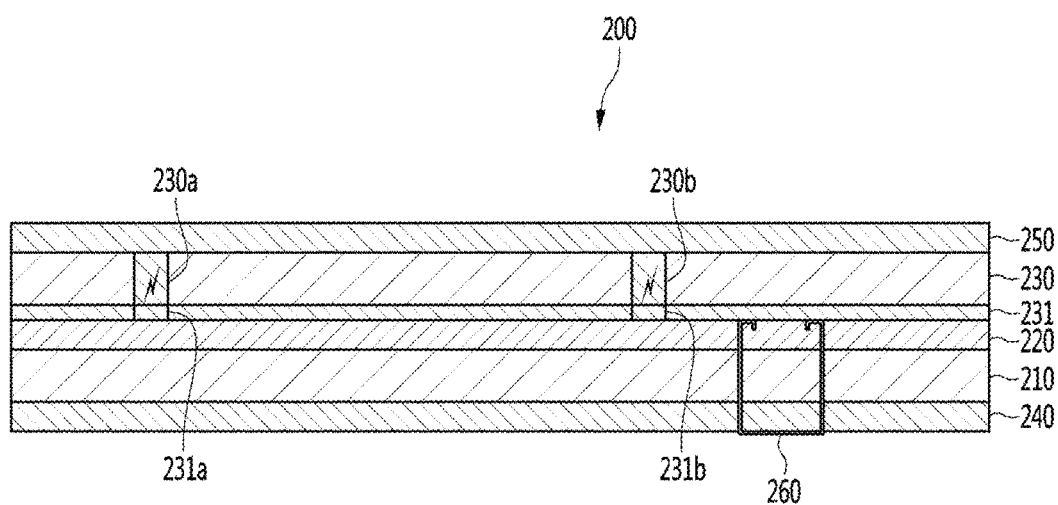

FIG. 3 illustrates an electromagnetic wave shield structure of an electric wire member in the configuration of FIG. 1. The electric wire member 200 basically includes an electric wire part 220 formed by applying a conductive paste on one surface of the flexible base film 210. In order to protect the electric wire part, a cover film 230 covered with a hot melt 231 is attached to the surface of the base film 210 on which the electric wire part 220 is formed, by thermocompression bonding, and in order to shield electromagnetic waves emitted from the electric wire part 220, an upper shield 250 and a lower shield 240 are respectively applied to the upper and lower portions of the assembly of the base film 210 and the cover film 230.

In addition, in order that the electric wire member 200 can block electromagnetic waves, one or more through-holes 230a, 230b, 231a, 231b may be formed through the cover film 230 and the hot melt 231 between the electric wire part 220 on the base film 210 and the upper shield 250 formed of a transparent electrode material in order to conduct the (−) line of the electric wire part 220 connected to the negative terminal (−) of the battery 340 (see FIG. 4) to the upper shield 250 and the lower shield 240, respectively. In addition, from the lower shield 240 to the electric wire 220, one or more through-holes (not shown) corresponding to the through-holes 230a, 230b, 231a, 231b are formed, and otherwise as a means for preventing or minimizing the disconnection of the electric wire part 220, the electrical connection between the (−) line of the electric wire part 220 and the lower shield 240 formed of a transparent electrode material may be made by wedging one or more metal pins 260 instead of the through holes (not shown) therebetween.

Through this configuration, the electric wire member 200 can completely shield electromagnetic waves emitted from the electric wire part 220 by electrically connecting the upper shield 250 and the lower shield 240 to the (−) line of the electric wire part 220 connected to the negative terminal (−) of the battery 340 (see FIG. 4) to ground the upper shield 250 and the lower shield 240.

Meanwhile, the conductive paste may be composed of at least one or more selected from materials having a high electrical conductivity, for example, from the group consisting of at least silver (Ag), gold (Au), copper (Cu), iron (Fe), nickel (Ni), and aluminum (Al).

In addition, the upper shield 250 and the lower shield 240 may be formed of at least one or more selected from the group consisting of at least silver (Ag), gold (Au), copper (Cu), iron (Fe), nickel (Ni), and aluminum (Al), as well as a transparent electrode material. In this case, the upper shield 250 and the lower shield 240 may be formed by applying at least one or more selected from the above mentioned materials to the upper and lower surfaces of the assembly of the base film 210 and the cover film 230 in a printing manner and causing this material to permeate through the through-holes, so that they can be electrically connected to the (−) line of the electric wire part 220.

Further, due to the characteristics of the wearable product, the base film 210 and the cover film 230 may be preferably formed of polyurethane (PU), which is a generally flexible material, such that they are not uncomfortable at least in terms of wearing and are also washable. In particular, the cover film 230 may be preferably polyurethane (PU) film, and more preferably thermoplastic polyurethane (TPU) film.

Figure 4:
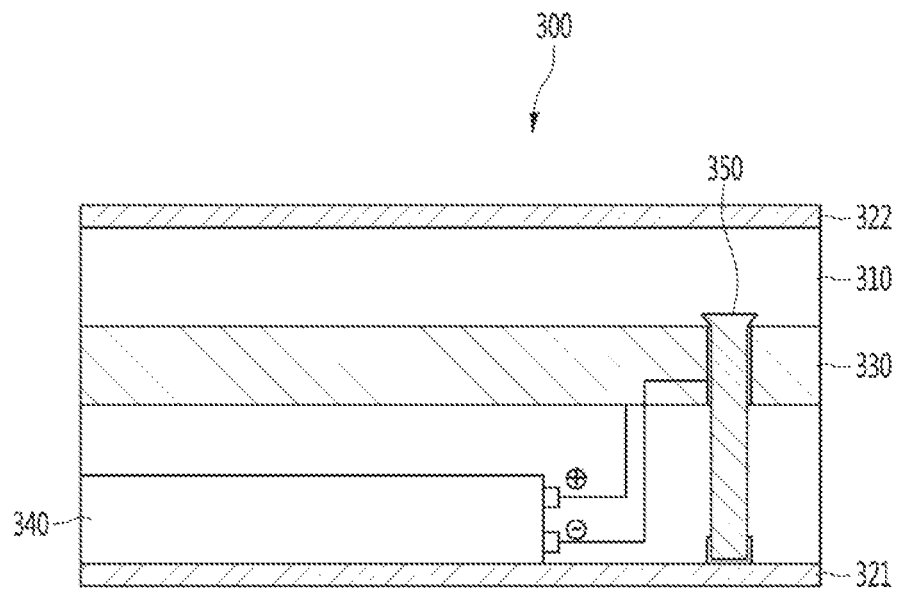

FIG. 4 illustrates an electromagnetic wave shield structure of an inverter in the configuration of FIG. 1. The inverter 300 basically includes, inside a case 310, a printed circuit board (PCB) 330 for controlling the operation of the EL product according to the present invention, and a battery 340 for supplying power to the PCB. In order to shield electromagnetic waves generated by the inverter 300, predetermined conducting materials 321 and 322 may be coated on at least upper and lower inner walls of the case 310. These conducting materials 321 and 322 are electrically connected to the negative electrode (−) of the battery 340 through the screw 350 for fastening the PCB 330 to be ground, thereby being capable of completely shielding electromagnetic waves generated from the inverter 300. In the present embodiment, the conducting material may be at least one or more selected generally from materials having excellent electrical conductivity, for example, from the group consisting of at least silver (Ag), gold (Au), copper (Cu), iron (Fe), nickel (Ni), and aluminum (Al).

Figure 5:
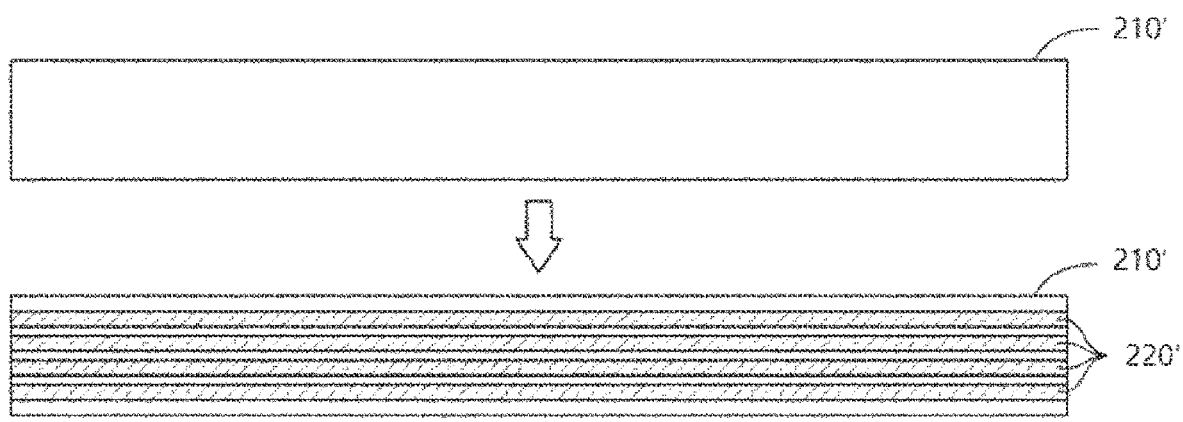
Figure 6:
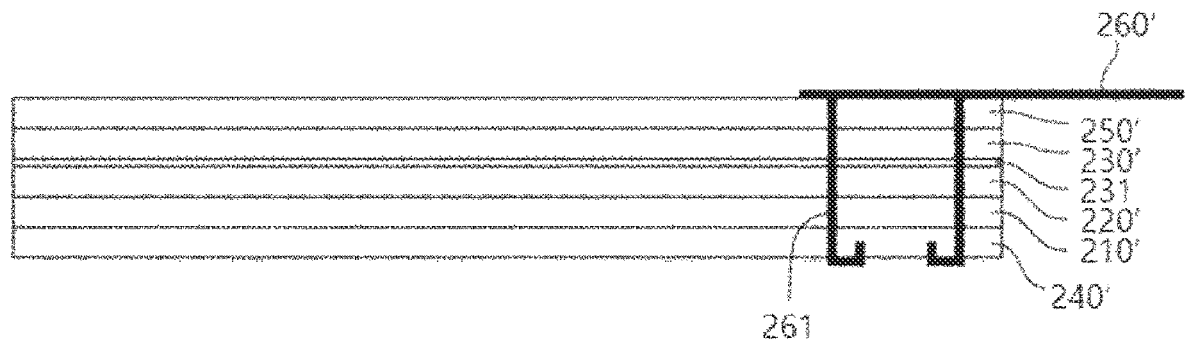
Figure 7:
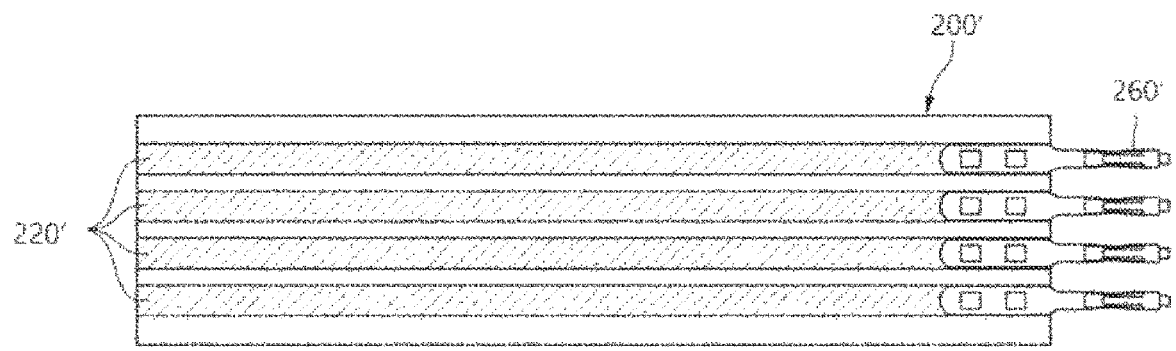

FIG. 5 is a top view for illustrating a method of forming a flexible wire for the electric wire member of FIG. 1 by applying a conductive paste to the base film; FIG. 6 is a cross-sectional view for illustrating an assembled state of a part of the flexible electric wire according to FIG. 5; and FIG. 7 is a top view for illustrating an assembled state of a part of the flexible electric wire according to FIG. 6.

As illustrated in FIG. 1, in the flexible electric wire for wearable EL product according to the present invention, the electric wire part 220' is formed by applying conductive paste on the surface of the base film 210' at regular intervals.

The base film 210' is preferably made of a transparent or translucent flexible polyurethane (PU) film. Using a conductive paste of a material with high electrical conductivity, for example, silver (Ag), the electric wire part 220' is formed by screen-printing at least one or more line, preferably two or more lines on the surface of the PU film which is the base film. As described above, the method of forming the electric wire part through screen printing on the base film 210' (hereinafter referred to as 'PU film') has an advantage that the flexible electric wire of the present invention can be made into various shapes so as to be easily used in a desired shape. Moreover, this method has an advantage that the manufacturing process is much simpler and is very advantageous in terms of cost efficiency compared to the conventional method of cutting a conductive film into several lines thinly and attaching them to the base film as many as the number of lines one by one. Meanwhile, the conductive paste may be at least one or more selected from the material group consisting of at least gold (Au), copper (Cu), iron (Fe), nickel (Ni), and aluminum (Al) having a high electrical conductivity, as well as the above-mentioned silver (Ag).

After the electric wire part 220' is formed, a PU (preferably TPU) single-sided sheet 230' to which a hot melt 231 is applied is thermocompression-bonded on the PU film 210' on which the electric wire part 220' has been formed, in order to protect the electric wire part. Reference numerals 240' and 250' not described in FIG. 6 denote 'a wire sheath' and may correspond to the upper shield 250 and the lower shield 240 in FIG. 3, respectively. Thereafter, a connector terminal 260' is installed at one end of the flexible electric wire configured as above, as illustrated in FIGS. 6 and 7. The connector terminal 260' has a plurality of connector pins 261 extending downward, and the connector pins 261 are wedged in on the surface of the electric wire and are fixed at the lower ends to the rear surface of the electric wire.

Meanwhile, in the conventional electric wire made of conductive fibers, the hole through which the pin passes is gradually widened and loosened during the repeated use due to the characteristic of the fiber material in the connection portion to which the connector pin is bound. As a result, the conventional electric wire made of conductive fibers is made disconnected at the pin binding portion as being used for a long period of time, whereas the flexible electric wire for wearable EL products according to the present invention includes the electric wire part 220' formed by printing or applying a conductive paste on the PU film 210', whereby even though the connector pin 261 is wedged in on the PU film 210' in order to bind the connector terminal 260' at the end of the electric wire, the pin hole formed on the surface of the PU film 210' is not made wider, but rather shrinks back to its original state over the time. Therefore, the wearable electric wire according to the present invention has an advantage that the connector pin 261 for binding the connector terminal 260 ' is in closer contact with the PU film 210' even though the wearable electric wire is used for a long period of time, so that the risk of disconnection at the pin binding portion disappears.

In the present invention, the conductive paste is preferably applied to a thickness of greater than or equal to 20 μm when printed to form the electric wire part 220' on the surface of the PU film 210'. This is because a very flexible property is required for the electric wire of the wearable EL product, and for example, when the thickness of the conductive paste is less than 20 μm, the wearable electric wire is easily broken due to wrinkling during daily life or during washing, thereby causing disconnection of the electric wire part. Therefore, according to the present invention, the thickness of the conductive paste applied on the PU film 210' is to be at least 20 μm, preferably in the range of 20 μm to 60 μm.

Accordingly, the flexible wire according to the present invention is provided with a flexible PU film as a base member, thus being softer than the conventional electric wire. As a result, the flexible wire has an advantage that a user feels less irritation when wearing a wearable device closely to the body. Moreover, it can be used safely for a long time without the risk of disconnection at the connection part where the connector terminals are bound.

Embodiment 2

Figure 8A:
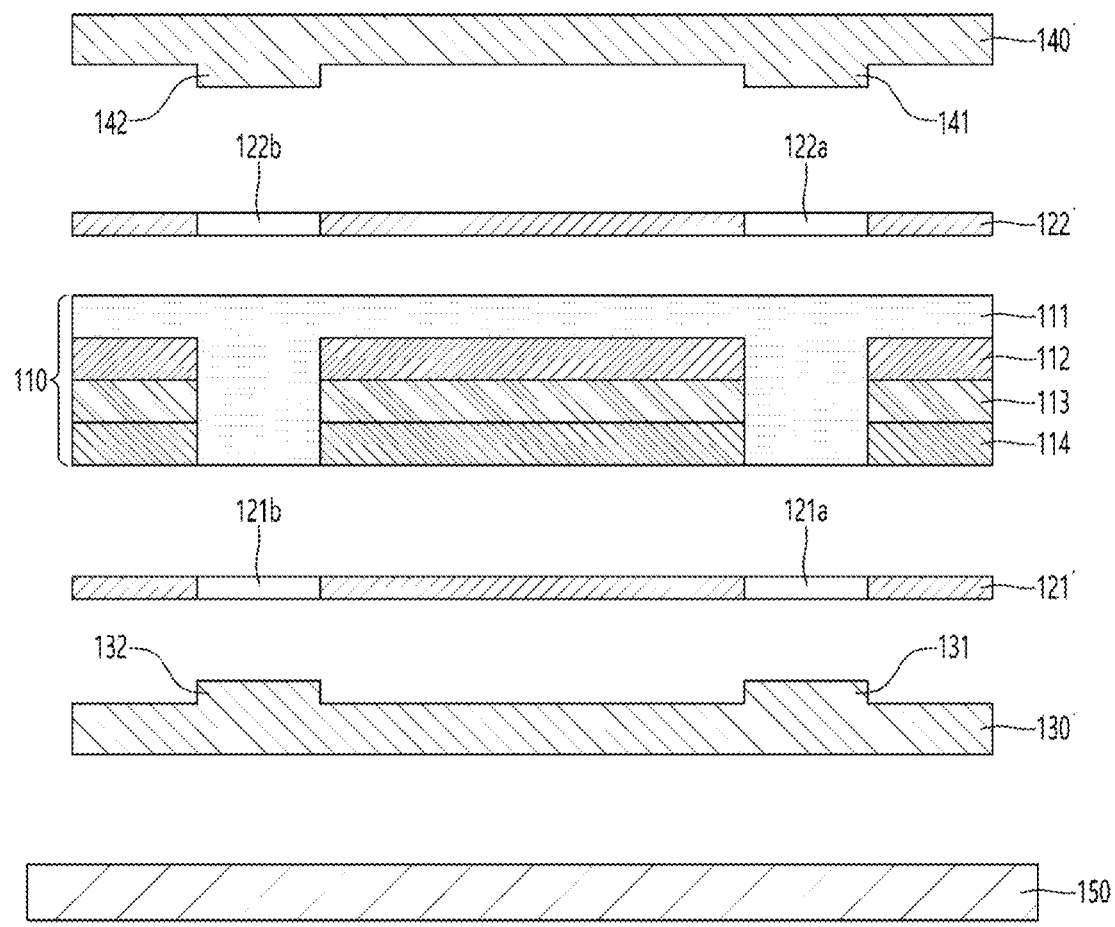
FIG. 8A is an exploded view of the light emitting unit.
Figure 8B:
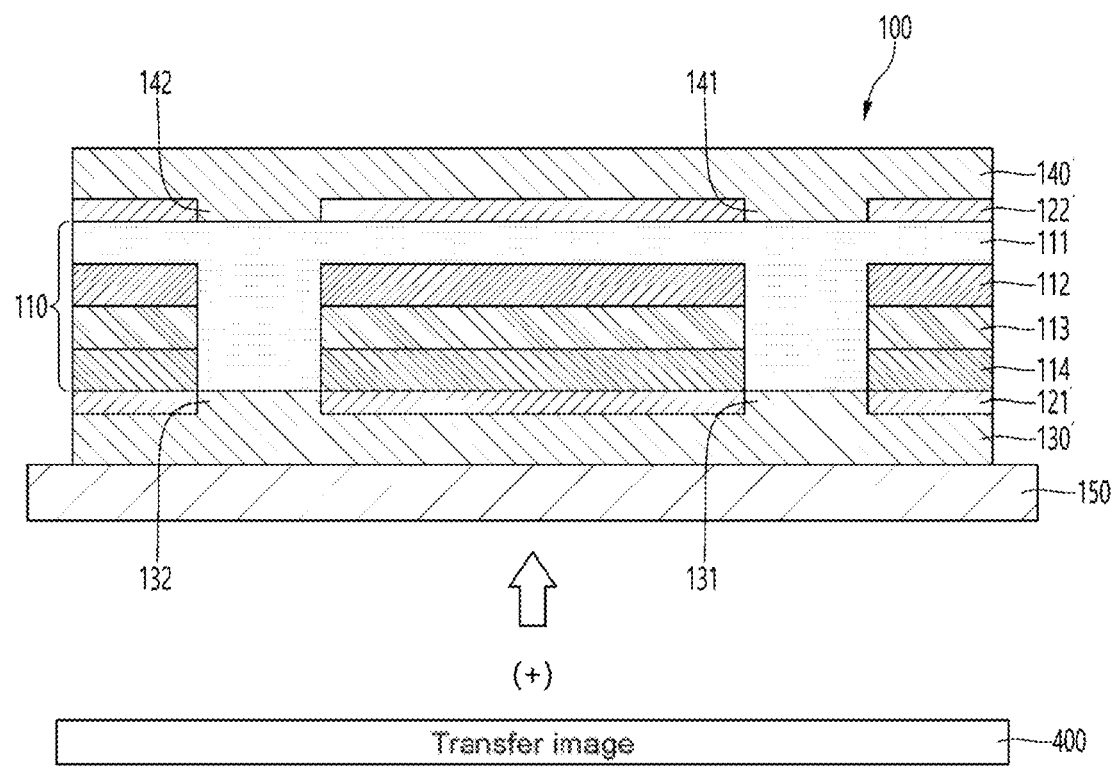
FIG. 8B is an assembled view of the light emitting unit.

FIG. 8 is a cross-sectional view of a first portion of the light emitting unit for explaining the operation of the light emitting unit in the configuration of FIG. 1, wherein FIG. 8A is an exploded view of the light emitting unit, and FIG. 8B is an assembled view of the light emitting unit.

In a wearable EL product of the present invention, a light emitting unit 100 basically comprises an EL member 110 which is an electroluminescence element coated with a fluorescent material according to a certain shape or pattern, insulators 121' and 122' disposed on front and rear surfaces of the EL member, respectively, a front electrode member 130' disposed on the opposite side of the front side insulator 121' from the EL member 110 to shield electromagnetic waves emitted from the EL member 110, a rear electrode member 140' disposed on the opposite side of the rear side insulator 122' from the EL member 110 to shield electromagnetic waves emitted from the EL member 110, and a base member 150 for supporting the front electrode member 130'.

The base member 150 may be formed of a transparent film of a predetermined thickness, for example, a film fabric made of PU or PET material. In addition, the front electrode member 130' and the rear electrode member 140' may also be made of a PU film, which is a flexible material, but in the present embodiment, the front electrode member 130' and the rear electrode member 140' are preferably formed by applying a liquid such as ink on the opposite side of the insulators 121' and 122' from the EL member 110, respectively with a constant thickness.

Further, the insulators 121' and 122' are disposed on the front and rear surfaces of the EL member 110 and may be provided in the form of a film such as an insulating film, but in the present embodiment, are preferably obtained by applying a liquid such as ink to the front and rear surfaces of the EL member 110 with a constant thickness.

The EL member 110 has a structure obtained by applying and laminating at least a transparent electrode layer 114, a fluorescent layer 113, a dielectric layer 112, and a conductive layer 111 in this order on a substrate having a predetermined thickness. In the present embodiment, the substrate may be the base member 150, on which the front electrode member 130' and the front side insulator 121' are coated (see FIG. 8B). The conductive layer 111 may have a plurality of circuits formed on the surface thereof, and may be basically made of a mixture of a conductive powder and a binder; a conductive organic polymer; or a mixture of a conductive powder and a conductive organic polymer. The conductive powder may include at least one of a carbon powder, a silver powder, a copper powder, and a silver-coated copper powder, and the conductive organic polymer may include a material such as 3,4-ethylenedioxythiophene (PEDOT:PSS), and polyethylenedioxythiophene (PEDOT:PSS). The dielectric layer 112 may be composed of a mixture of a dielectric powder and a binder, wherein the dielectric powder may be a dielectric powder having a high dielectric constant such as $BaTio_3$, and a size of about 1-10 µm. The binder used for the dielectric layer 112 may be a polymer having a high dielectric constant, such as a cyanoethylpullulan or a fluororesin. The fluorescent layer 113 is made of a phosphor powder and a binder. The phosphor powder may be a group II-IV compound such as ZnS. The binder used for the fluorescent layer 113 preferably has a higher dielectric constant than that of the phosphor powder. The binder having a high dielectric constant may include a cyanoethyl pullulan, and a fluororesin. In order to change the emission color of the electroluminescence element, a fluorescent dye such as rhodamine or a fluorescent pigment may be mixed with the binder of the fluorescent layer. The transparent electrode 114 may be composed of an ITO powder and a binder, composed of an ITO thin film layer formed using a sputtering method, or composed of a conductive organic polymer, or a mixture of a conductive organic polymer and an ITO powder.

The EL member 110 has a structure obtained by applying and laminating the transparent electrode layer 114, the fluorescent layer 113, the dielectric layer 112, and the conductive layer 111 in this order from the front side of the light emitting unit 100. The conductive layer 111 has a structure electrically connected to the front electrode member 130' and the rear electrode member 140', respectively. In the present embodiment, each of the front electrode member 130' and the rear electrode member 140' may be formed of a transparent electrode material. The electrode member 130 may have at least one of connection terminals 131 and 132 formed to be electrically connected to each part of the circuit of the conductive layer 111. Similarly, the electrode member 140' may have at least one of connection terminals 141 and 142 formed to be electrically connected to each part of the circuit of the conductive layer 111.

In the light emitting unit 100 configured in this way, as shown in FIG. 8B, when power is applied from an external inverter 300 (see FIG. 1) through the conductive layer 111 in a state in which a transfer image 400 is transferred by thermocompression bonding, each part of the fluorescent layer 113 selectively emits light, thereby causing the transfer image 400 to emit light.

Figure 9A:
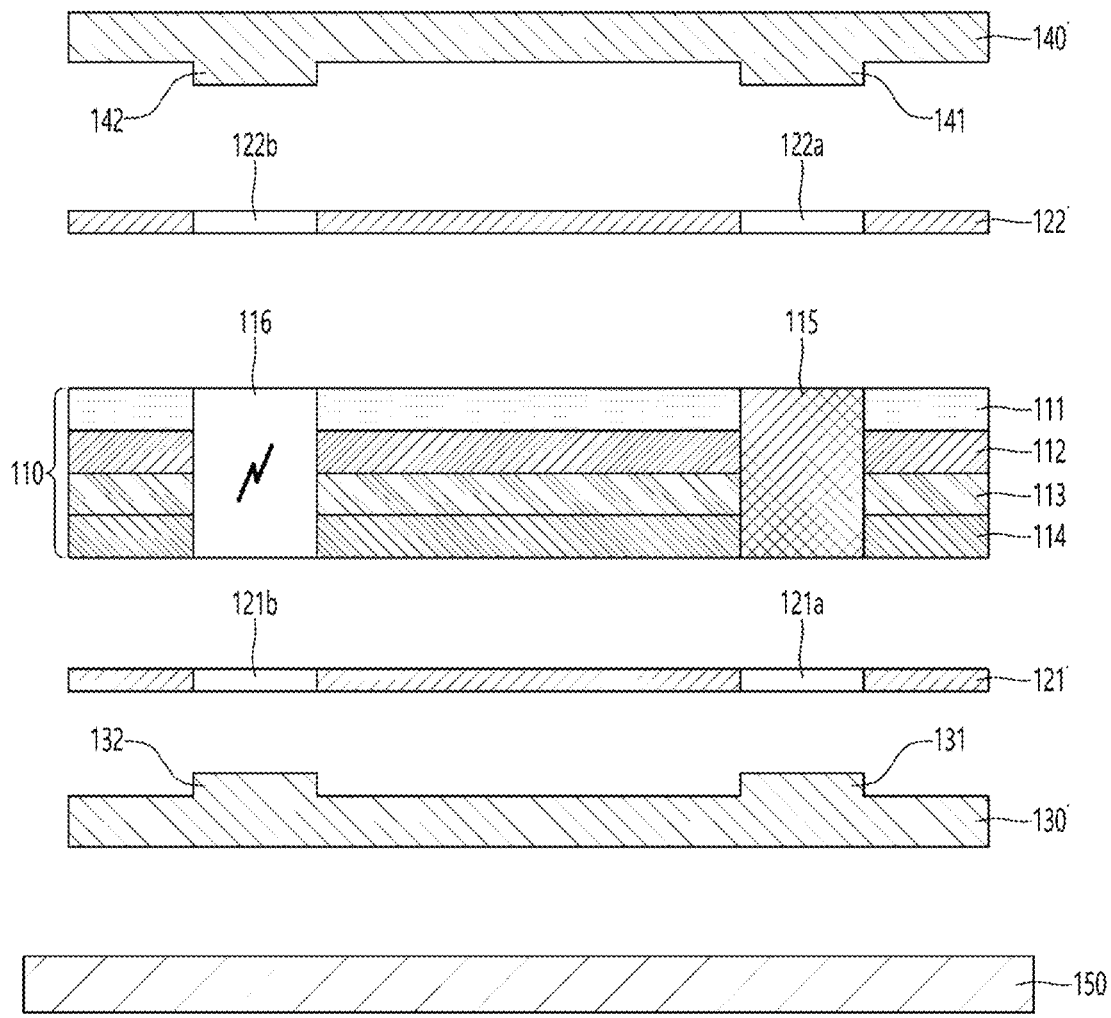
FIG. 9A is an exploded view of the light emitting unit.
Figure 9B:
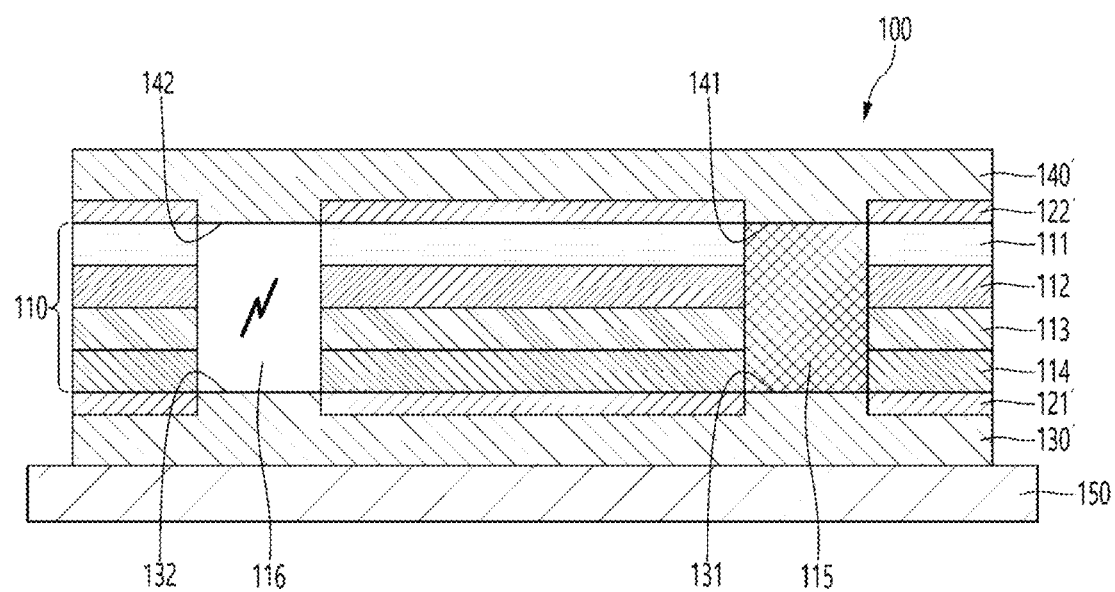
FIG. 9B is an assembled view of the light emitting unit.

FIG. 9 is a cross-sectional view of a second portion of the light emitting unit for explaining the electromagnetic wave shield structure of the light emitting unit according to FIG. 8, wherein FIG. 9A is an exploded view of the light emitting unit, and FIG. 9B is an assembled view of the light emitting unit.

As described above, the EL member 110 has a structure in which the transparent electrode layer 114, the fluorescent layer 113, the dielectric layer 112, and the conductive layer 111 are laminated in this order from the front side, wherein a plurality of circuits may be formed on the surface of the conductive layer 111 made of a mixture of a conductive powder and a binder; a conductive organic polymer; or a mixture of the conductive powder and the conductive organic polymer. In any one of these circuits, as a structure for shielding electromagnetic wave generation in the light emitting unit 100, a ground terminal 115 for electrical grounding to the negative terminal (–) of the battery 340 (see FIG. 4) in the inverter 300 through at least one electric wire line (see FIG. 10) of the electric wire member 200 may be formed.

The ground terminal 115 is electrically connected to the connection terminal 131 of the front electrode member 130' and the connection terminal 141 of the rear electrode member 140' corresponding to this connection terminal. For this end, the front side insulator 121' and the rear side insulator 122' for the EL member 110 may have through-holes 121a and 122a respectively formed at locations corresponding to the connection terminal 131 of the front electrode member 130' and the connection terminal 141 of the rear electrode member 140'.

In addition, in order to electrically conduct between the connection terminal 132 of the front electrode member 130' and the connection terminal 142 of the rear electrode member 140' corresponding to this connection terminal, through holes 121b and 122b may be respectively formed in the front side insulator 121' and the rear side insulator 122' for the EL member 110, and a through hole 116 corresponding to the through holes 121b and 122b may also be formed in the EL member 110.

In the present embodiment, the front electrode member 130' and the rear electrode member 140' may be formed of a transparent electrode material. This transparent electrode material may be formed on a polyurethane (PU) film, which is a flexible material, but may also be formed by coating on the surfaces of the front side insulator 121' and the rear side insulator 122' of the EL member 110, respectively, in a printing manner. In this case, the transparent electrode material is permeated through the through holes 121a, 121b, 122a, and 122b, so that the front electrode member and the rear electrode member may be electrically connected to each other.

From this configuration, the light emitting unit 100 can completely shield electromagnetic waves emitted from the EL member 110 since the front electrode member 130' and the rear electrode member 140' are electrically connected to each other, and electrically grounded to the negative terminal (–) of the battery 340 (see FIG. 4) in the inverter 300 through the electric wire member 200.

Figure 10A:
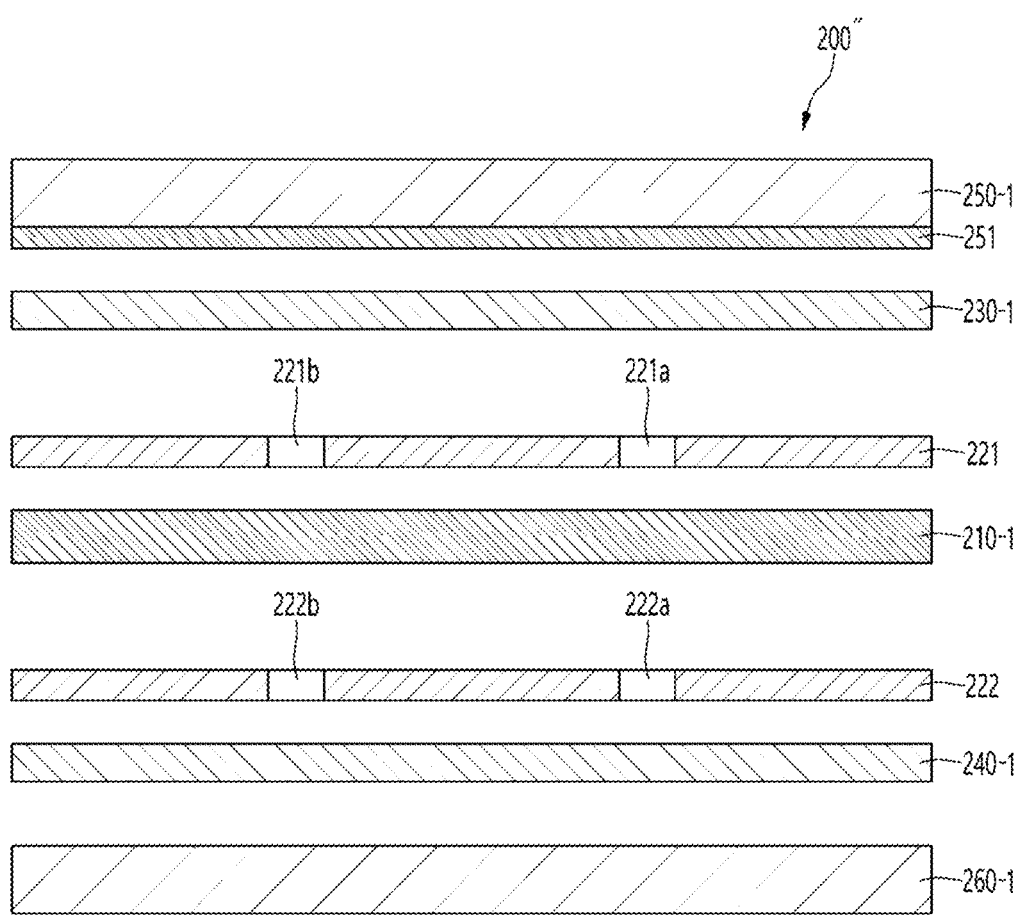
Figure 10B:
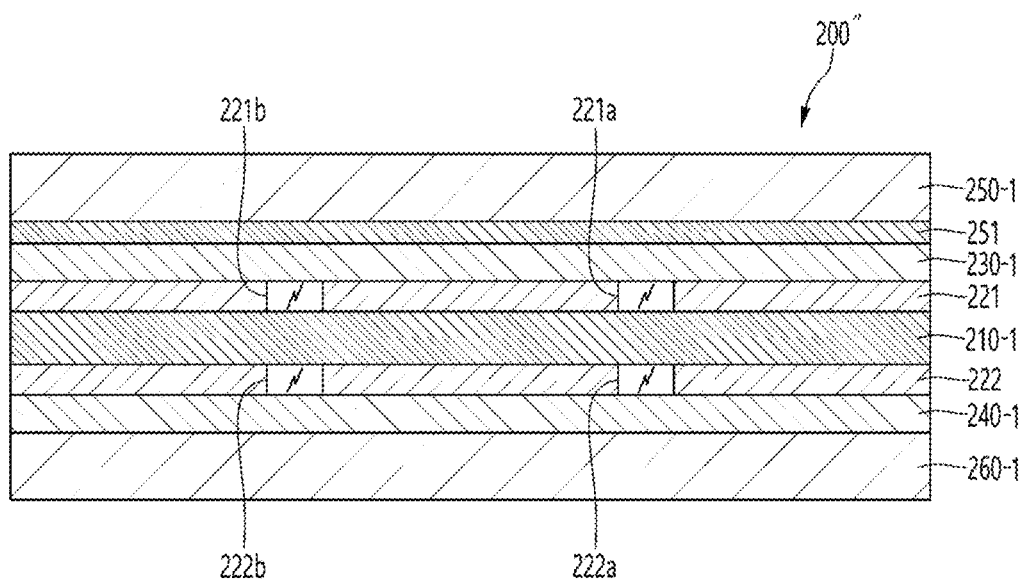

FIGS. 10A and 10B illustrate an electromagnetic wave shield structure of electric wire member the in the configuration of the wearable EL product shown in FIG. 1. The electric wire member 200" basically includes an electric wire 210 formed by applying a conductive paste on a plurality of lines, an upper insulator 221 and a lower insulator 222 disposed on upper and lower surfaces of the electric wire, respectively, an upper electrode member 230-1 disposed on the opposite side of the upper insulator 221 from the electric wire 210 to shield electromagnetic waves emitted from the electric wire 210, a lower electrode member 240-1 disposed on the opposite side of the lower insulator 222 from the electric wire 210 to shield electromagnetic waves emitted from the electric wire 210, and a base member 260-1 disposed on the opposite side of the lower electrode member 240-1 from the electric wire 210.

The base member 260-1 may be made of a transparent film having a predetermined thickness, for example, a film fabric composed of polyurethane (PU) or PET material. In addition, although the upper electrode member 230-1 and the lower electrode member 240-1 may also be made of a material such as a polyurethane (PU) film, which is a flexible material, but in the present embodiment, the upper electrode member 230-1 and the lower electrode member 240-1 may be preferably provided in the form of a liquid such as ink, which is applied on the opposite side of the insulators 221 and 222 from the electric wire 210, respectively, with a constant thickness.

Optionally, the upper cover member 250-1 may be attached on the opposite side of the upper electrode member 230-1 from the electric wire 210. This upper cover member 250-1 serves as protecting the electric wire 210 together with the base member 26, and it may be made of a transparent film, for example, a film fabric composed of polyurethane (PU) or PET material, having a predetermined thickness to which a hot melt 251 is applied to facilitate attachment to each electrode member, wherein the hot melt 251 is attached by thermocompression bonding.

The upper and lower insulators 221 and 222 may be made of a material such as an insulating film, but in the present embodiment, the upper and lower insulators may be preferably provided in the form of a liquid such as ink, which is applied to the upper and lower surfaces of the electric wire 210 with a constant thickness.

From the above configuration, in the electric wire member 200" of the present embodiment, the lower electrode member 240-1, the lower insulator 222, the electric wire 210, the upper insulator 221, and the upper electrode member 230-1 may be sequentially applied on the base member 260-1, and the upper cover member 250-1 optionally coated with a hot melt may be attached thereto.

Meanwhile, in the present embodiment, the electric wire member 200" may have a configuration in which the upper electrode member 230-1 and the lower electrode member 240-1 are electrically connected to each other and electrically grounded to the negative terminal (−) of the battery 340 (see FIG. 4) in the inverter 300, in order to more completely shield electromagnetic waves. To this end, one or more through-holes 221a and 221b may be formed in the upper insulator 221 to conduct electricity between the electric wire 210 and the upper electrode member 230-1 located on the upper surface of the electric wire, and also one or more through-holes 222a and 222b corresponding to the through-holes 221a and 221b may be formed in the lower insulator 222 to conduct electricity between the electric wire 210 and the lower electrode member 240-1 located on the lower surface of the electric wire. The upper electrode member 230-1 and the lower electrode member 240-1 are connected to at least one line on the electric wire 210 through these through holes 221a, 221b, 222a, and 222b, and thus electrically grounded to the negative terminal (−) of the battery 340 (see FIG. 4) in the inverter 300.

Through such a configuration, the electric wire member 200" can completely shield electromagnetic waves emitted from the electric wire 210 by allowing electrical conduction between the upper electrode member 230-1 and the lower electrode member 240-1.

In addition, the upper electrode member 230-1 and the lower electrode member 240-1 may be formed of a transparent electrode material. This transparent electrode material may be formed on a polyurethane (PU) film, which is a flexible material, but may also be formed by coating on the upper surface of the upper insulator 221 and the lower surface of the lower insulator 222, respectively, in a printing manner. In this case, the transparent electrode material is permeated through the through holes 221a, 221b, 222a, and 222b, so that the upper electrode member and the lower electrode member may be electrically connected to each other.

In the above, the conductive paste may be at least one r more selected from materials having generally excellent electrical conductivity, for example, from the group consisting of at least silver (Ag), gold (Au), copper (Cu), iron (Fe), nickel (Ni), and aluminum (Al).

In particular, due to the characteristics of the wearable product, the upper cover member 250-1 and the base member 260-1 may be preferably formed using a TPU or PU film, which is a generally flexible material, so that they are not uncomfortable at least in terms of wearing and are also washable.

Although various embodiments of the present invention have been described above, the embodiments have been described so far are merely illustrative of some of the preferred embodiments of the present invention, and the scope of the present invention is not limited by the embodiments described above, except for the appended claims. Accordingly, it is understood that those having ordinary knowledge in the same technical field can make many changes, modifications and substitutions of equivalents without departing from the technical spirit and gist of the invention within the scope of the following claims.

What is claimed is:

1. An electromagnetic wave shield structure of a wearable electroluminescence (EL) product comprising:
    a light emitting unit which is a luminous body;
    an electric wire member extending from the light emitting unit; and
    an inverter for controlling a power-on/off and an operation of the light emitting unit,
    wherein the wearable EL product is washable and flexible so as to be applicable to all items that can be worn by humans, including clothing, hats, footwear, gloves, and accessories,
    wherein the light emitting unit comprises an EL member that is an electroluminescence element coated with a fluorescent material according to a certain shape or pattern, hot melts respectively applied to front and rear surfaces of the EL member, a rear shield attached to the rear surface of the EL member by a hot melt to shield electromagnetic waves emitted from the EL member, and a front shield attached to the front surface of the EL member by the hot melt to shield electromagnetic waves emitted from the EL member,
    wherein the EL member, the rear shield and the front shield are formed on a polyurethane film which is flexible, and the rear shield and the front shield are composed of a transparent electrode material, respectively, and
    wherein the electromagnetic wave shield structure is configured to shield electromagnetic waves emitted from the light emitting unit by allowing electrical conduction among the EL member, the rear shield, and the front shield.

2. The electromagnetic wave shield structure of the wearable EL product according to claim 1,
    wherein a plurality of circuits are formed on a surface of the EL member, and a ground terminal for grounding by electrically connecting to a negative terminal (−) of a battery is formed in any one of the circuits,
    wherein the rear shield and the front shield have one or more of connection terminals respectively formed on the surface thereof for connection to the ground terminal of the EL member, and
    wherein for electrical conduction among the connection terminals formed on the surfaces of the rear shield and the front shield, the EL member and the hot melts have through-holes respectively formed at locations corresponding to the connection terminals.

3. The electromagnetic wave shield structure of the wearable EL product according to claim 1,
wherein the electric wire member includes a base film made of a flexible material, an electric wire part formed by applying a predetermined conductive paste on one surface of the base film, a hot melt-coated cover film attached to one surface of the base film on which the electric wire part is formed, and an upper shield and a lower shield respectively applied to the upper and lower portions of an assembly of the base film and the cover film to shield electromagnetic waves emitted from the electric wire part, and
wherein the electromagnetic wave shield structure is configured to shield electromagnetic waves emitted from the electric wire part by allowing electrical conduction between a (−) line of the electric wire part connected to a negative terminal (−) of a battery and the upper shield and the lower shield.

4. The electromagnetic wave shield structure of the wearable EL product according to claim 3,
wherein for shielding electromagnetic waves emitted from the electric wire member, the cover film has one or more through-holes respectively formed through the cover film and the hot melt between the electric wire on the base film and the upper shield, and
wherein one or more through-holes corresponding to the through-holes on the cover film and the hot melt are formed from the lower shield to the electric wire, or one or more metal pins are wedged in instead of the through-holes for electrical conduction between the (−) line of the electric wire part and the lower shield, thereby preventing or minimizing disconnection of the electric wire member.

5. The electromagnetic wave shield structure of the wearable EL product according to claim 3,
wherein the electric wire part is formed by screen-printing one or two or more lines of the conductive paste on the surface of the base film, and the conductive paste is at least one or more selected from a material group consisting of at least silver (Ag), gold (Au), copper (Cu), iron (Fe), nickel (Ni), and aluminum (Al).

6. The electromagnetic wave shield structure of the wearable EL product according to claim 3,
wherein the front shield and the rear shield, or the upper shield and the lower shield are made of at least one or more selected from a material group consisting of at least a transparent electrode material, silver (Ag), gold (Au), copper (Cu), iron (Fe), nickel (Ni), and aluminum (Al), and
wherein the base film and the cover film are composed of polyurethane of a flexible material that is comfortable to wear and easy to wash, and the cover film is at least TPU or PU film.

7. The electromagnetic wave shield structure of the wearable EL product according to claim 1,
wherein the inverter includes, inside a case, a printed circuit board (PCB) for controlling the operation of the EL product, and a battery for supplying power to the PCB, and
wherein a predetermined conductive material is coated on at least upper and lower inner walls of the case, the conductive material being grounded to a negative terminal (−) of the battery through a screw for fastening the PCB, thereby shielding electromagnetic waves generated from the inverter.

8. An electromagnetic wave shield structure of a wearable electroluminescence (EL) product comprising:
a light emitting unit which is a luminous body;
an electric wire member extending from the light emitting unit; and
an inverter for controlling power on/off and operation of the light emitting unit,
wherein the wearable EL product is flexible and washable so as to be applicable to all items that can be worn by humans, including clothing, hats, footwear, gloves, and accessories, and
wherein the light emitting unit includes an EL member that is a electroluminescence element applied with a fluorescent material according to a certain shape or pattern, a front side insulator and a rear side insulator respectively disposed on front and rear surfaces of the EL member, a front electrode member disposed on the opposite side of the front side insulator from the EL member to shield electromagnetic waves emitted from the EL member, a rear electrode member disposed on the opposite side of the rear side insulator from the EL member to shield electromagnetic waves emitted from the EL member, and a base member for supporting the front electrode member.

9. The electromagnetic wave shield structure of the wearable EL product according to claim 8,
wherein the front electrode member and the rear electrode member are made of a transparent electrode material, respectively, the EL member has a structure obtained by applying and laminating at least a transparent electrode layer, a fluorescent layer, a dielectric layer, and a conductive layer in this order on a substrate having a predetermined thickness, and each of the electrode members has one or more connection terminals formed to be electrically connected to each part of a circuit of the conductive layer, and
wherein as a structure for shielding electromagnetic waves emitted from the EL member, the light emitting unit is connected to any one of a plurality of circuits on the surface of the conductive layer to be grounded to a negative terminal (−) of battery in the inverter through the electric wire member in a state in which the front electrode member and the rear electrode member are electrically connected to each other.

10. The electromagnetic wave shield structure of the wearable EL product according to claim 9,
wherein the conductive layer is made of a mixture of a conductive powder and a binder, a conductive organic polymer, or a mixture of a conductive powder and a conductive organic polymer, and has a plurality of circuits formed on the surface thereof to be electrically connected to the front electrode member and the rear electrode member, respectively, the dielectric layer is composed of a mixture of a dielectric powder and a binder, the fluorescent layer is made of a phosphor powder and a binder, and the transparent electrode layer is composed of an ITO powder and a binder, composed of an ITO thin film layer formed using a sputtering method, or composed of a conductive organic polymer, or a mixture of a conductive organic polymer and an ITO powder.

11. The electromagnetic wave shield structure of the wearable EL product according to claim 9,
wherein the EL member has a ground terminal connected to at least one line of the electric wire member grounded to the negative terminal (−) of the battery in the inverter, the ground terminal being electrically connected to any one of the connection terminals of the rear electrode member and any one of the connection terminals of the front electrode member corresponding thereto, and wherein the rear side insulator and the front side insulator of the EL member have through-holes respectively formed at locations corresponding to a connection terminal of the rear electrode member and the connection terminal of the front electrode member, and for electrical conduction between the connection terminal of the rear electrode member and the connection terminal of the front electrode member corresponding thereto, the EL member and the rear side insulator and the front side insulator of the EL member have through-holes respectively formed thereon.

12. The electromagnetic wave shield structure of the wearable EL product according to claim 9, wherein the electric wire member includes an electric wire formed by applying a conductive paste, an upper insulator and a lower insulator respectively disposed on upper and lower surfaces of the electric wire, an upper electrode member disposed on the opposite side of the upper insulator from the electric wire to shield electromagnetic waves emitted from the electric wire, a lower electrode member disposed on the opposite side of the lower insulator from the electric wire to shield electromagnetic waves emitted from the electric wire, and a base member disposed on the opposite side of the lower electrode member from the electric wire to protect the electric wire, and optionally further comprising an upper cover member disposed on the opposite side of the upper electrode member from the electric wire.

13. The electromagnetic wave shield structure of the wearable EL product according to claim 12, wherein for shielding electromagnetic waves emitted from the electric wire, the upper electrode member and the lower electrode member are electrically connected to each other, the electrically connected upper electrode member and lower electrode member being connected to at least one line on the electric wire and grounded to the negative terminal (−) of the battery in the inverter, and wherein for electrical conduction between the electric wire and the upper and lower electrode members, the upper insulator and the lower insulator have one or more through-holes corresponding to each other respectively formed thereon.

14. The electromagnetic wave shield structure of the wearable EL product according to claim 12, wherein the upper electrode member and the lower electrode member are composed of a transparent electrode material, respectively, and the conductive paste is composed of at least one or more selected from a material group consisting of at least silver (Ag), gold (Au), copper (Cu), iron (Fe), nickel (Ni), and aluminum (Al).

15. The electromagnetic wave shield structure of the wearable EL product according to claim 12, wherein the base member is composed of a transparent film of polyurethane (PU) or PET material having a predetermined thickness, and the insulators are provided in the form of a liquid such as ink, which is applied on the front and rear surfaces of the EL member or the upper and lower surfaces of the electric wire, respectively, with a constant thickness.

16. The electromagnetic wave shield structure of the wearable EL product according to claim 8, wherein the inverter includes, inside a case, a printed circuit board (PCB) for controlling the operation of the EL product, and a battery for supplying power to the PCB, and wherein a predetermined conductive material is coated on at least upper and lower inner walls of the case, the conductive material being grounded to a negative terminal (−) of the battery through a screw for fastening the PCB, thereby shielding electromagnetic waves generated from the inverter.

* * * * *